(12) United States Patent
Gilbertson et al.

(10) Patent No.: US 12,210,441 B2
(45) Date of Patent: *Jan. 28, 2025

(54) RELAY AND METERING TEST INSTRUMENT

(71) Applicant: Doble Engineering Company, Watertown, MA (US)

(72) Inventors: Scott Harold Gilbertson, Burlington, CA (US); Kevin M. Sullivan, Waltham, MA (US)

(73) Assignee: Doble Engineering Company, Watertown, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,061

(22) Filed: Jan. 12, 2024

(65) Prior Publication Data

US 2024/0152445 A1    May 9, 2024

Related U.S. Application Data

(63) Continuation of application No. 17/554,698, filed on Dec. 17, 2021, now Pat. No. 11,886,324.

(51) Int. Cl.
*G06F 11/36* (2006.01)

(52) U.S. Cl.
CPC ........ *G06F 11/3664* (2013.01); *G06F 11/368* (2013.01); *G06F 11/3688* (2013.01)

(58) Field of Classification Search
CPC .... G06F 11/14; G06F 11/3664; G06F 11/368; G06F 11/3688

See application file for complete search history.

(56) References Cited

U.S. PATENT DOCUMENTS

| | | | | |
|---|---|---|---|---|
| 5,606,568 | A | * | 2/1997 | Sudweeks ........ G01R 31/31908 714/729 |
| 5,761,440 | A | * | 6/1998 | De Marco ............... H04L 45/00 370/392 |

(Continued)

FOREIGN PATENT DOCUMENTS

WO    WO-2010054669 A1    5/2010

OTHER PUBLICATIONS

Doble Engineering Company, "F6000 Family of Power System Simulators User Guide," Watertown, MA, Feb. 2001, 228 pages.

(Continued)

*Primary Examiner* — Kamini B Patel
(74) *Attorney, Agent, or Firm* — Harness, Dickey & Pierce, P.L.C.; Anthony G. Fussner

(57) ABSTRACT

A relay and metering test instrument includes an application processor circuitry to control functional operation of the relay and metering test instrument. The application processor circuitry may receive a user selected source code state program, and operational parameters input by the user. The application processor circuitry may compile the source code state program and the operational parameters into a test routine for storage in a memory circuitry with other test routines. The relay and metering instrument may also include a real time processor circuitry and an input/output processor circuitry. The real time processor circuitry may selectively and independently execute the test routine or one of the other test routines to perform one or more respective testing stages. The input/output processor circuitry may cooperatively operate with the real time processor circuitry to output test signals and monitor for receipt of input test signals according to execution of the test routine.

30 Claims, 6 Drawing Sheets

(56) References Cited

U.S. PATENT DOCUMENTS

| | | | |
|---|---|---|---|
| 7,248,986 B2 | 7/2007 | Klijn et al. | |
| 8,548,996 B2* | 10/2013 | Tareen | G06F 16/24578 |
| | | | 707/723 |
| 11,886,324 B2* | 1/2024 | Gilbertson | G06F 11/3664 |
| 2007/0016829 A1* | 1/2007 | Subramanian | G06F 11/3684 |
| | | | 714/38.1 |
| 2009/0033356 A1* | 2/2009 | Starkell | G01R 31/3272 |
| | | | 323/265 |
| 2009/0254291 A1* | 10/2009 | Benmouyal | G01R 19/2509 |
| | | | 702/75 |
| 2011/0310518 A1* | 12/2011 | Komatsu | H02H 3/305 |
| | | | 361/64 |
| 2013/0107400 A1* | 5/2013 | Meng | G01R 31/343 |
| | | | 361/21 |
| 2013/0282323 A1* | 10/2013 | Gao | H02H 1/0092 |
| | | | 702/117 |
| 2023/0195602 A1* | 6/2023 | Gilbertson | G06F 11/3688 |
| | | | 714/38.1 |

OTHER PUBLICATIONS

Manta Test Systems, "MTS-5100 Protective Relay Test System User's Manual," Ontario, Canada, First Edition Aug. 2012, 178 pages.

U.S. Appl. No. 17/554,698, filed Dec. 17, 2021.

\* cited by examiner

RELAY AND METERING TEST INSTRUMENT

CROSS-REFERENCE TO RELATED APPLICATION

This application is a continuation of U.S. patent application Ser. No. 17/554,698 filed Dec. 17, 2021 (published as US2023/0195602 and issuing as U.S. Pat. No. 11,886,324 on Jan. 30, 2024), which is incorporated herein by reference in its entirety.

TECHNICAL FIELD

This disclosure relates to test instruments and more particularly to relay and metering test instruments.

BACKGROUND

Relays and metering are an important part of power generation, power transmission, and power consumption in electric power systems and the power grid. Relays provide monitoring and protection of equipment and personnel. Metering not only provides tracking of generation, consumption and performance, but also provides signals used for control and relaying. Accurate, repeatable and reliable relaying and metering is important. Testing to confirm accuracy, operation, health and functionality of relays, metering and power equipment may be accomplished by simulating different power system conditions. Effective and versatile test equipment is needed to minimize downtime, minimize damage to equipment, and maintain fully accurate and correct operation of power equipment.

DETAILED DESCRIPTION

Figure 1:
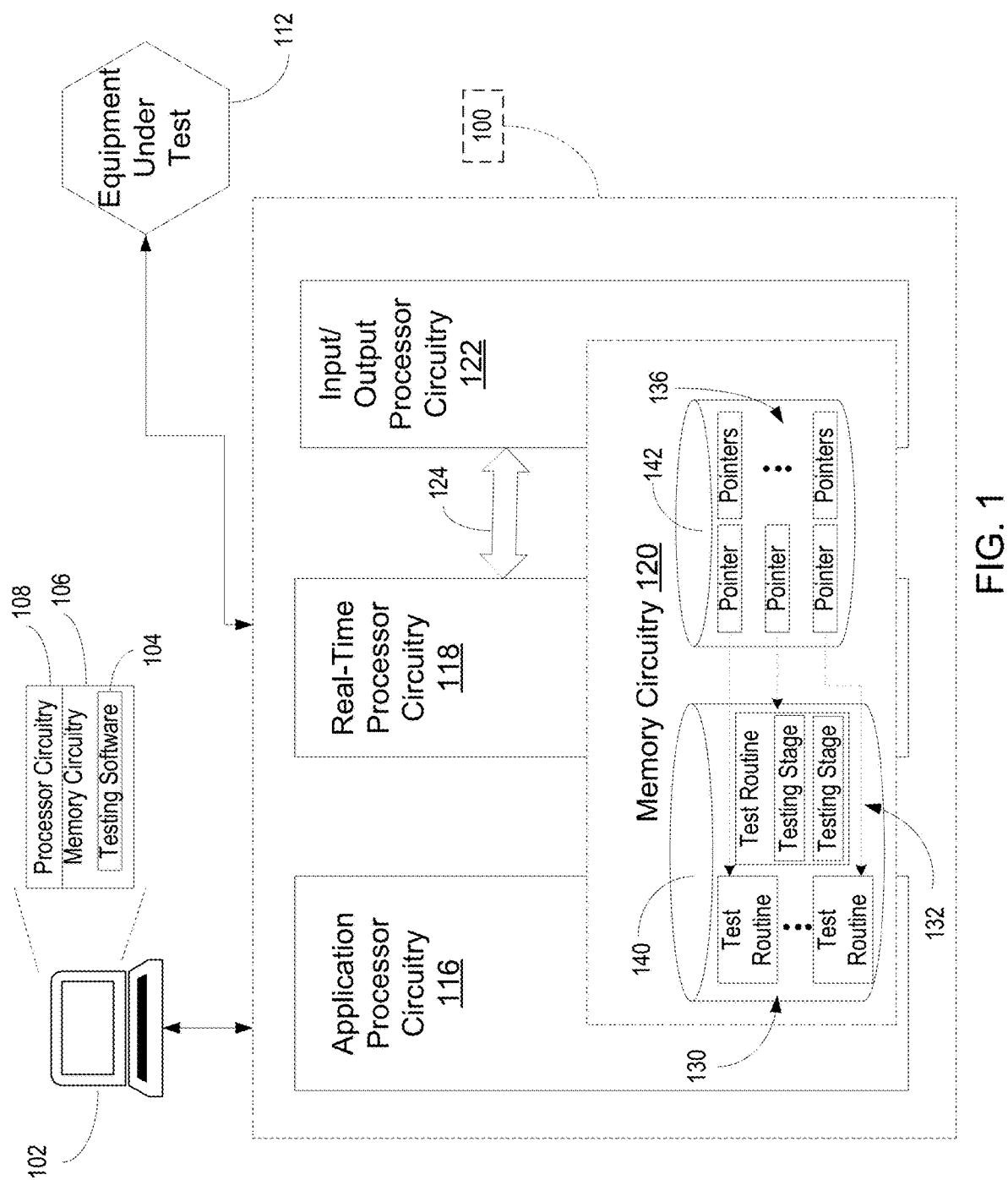
FIG. 1 is a block diagram of an example of relay metering test instrument in communication with a testing computer and one or more pieces of power equipment under test.

The discussion below makes reference to a relay and metering test instrument for testing equipment such as protective relays and metering in power systems. The instrument performs this testing by providing real-time control and adjustment of the parameters that define sample waveforms being generated by the instrument for application to the equipment under test. The parameters, for each waveform output, may be: Amplitude (volts or amperes); Phase angle, relative to a reference; and frequency. For complex waveforms, such as those involving harmonics, multiple sets of amplitude, phase and frequency may be used to generate multiple waveforms, which may be summed by the instrument to produce a combined waveform.

Testing with the relay and metering test instrument involves operating the relay test instrument with an application processor circuitry that receives a source code state program and an operational parameter via a user interface as inputs by a user. The instrument may compile, with the application processor circuitry, the source code state program and the operational parameter into a test routine. The test routine may be stored in a memory circuitry with a plurality of other test routines. The instrument may independently execute, with a real time processor circuitry, the plurality of other test routines stored in the memory circuitry, and also independently execute, with the real time processor circuitry, the test routine stored in the memory circuitry to perform a plurality of respective testing stages. In addition, the instrument may generate, with an input/output processor circuitry, a waveform for equipment under test as directed by execution of the test routine.

An interesting feature of the instrument relates to directing, with the input/output processor circuitry, the real time processor circuitry to execute different respective test routines, where the different test routines are identified to the input/output processor circuitry by the application processor circuitry when the source code state program and the operational parameter(s) for a respective test routine are compiled.

Another interesting feature relates to the application processor circuitry, when storing the test routine in the memory circuitry, identifying respective memory locations in the memory circuitry of each of the respective test routines, and generating and storing respective pointers to the respective memory locations in the memory circuitry. The respective pointers may be accessed by the input/output processor circuitry to direct the real time processor circuitry to execute different respective test routines.

A further interesting feature of the instrument is that it provides the capability to dynamically alter the parameters in various ways during a test. For example, smoothly ramping a parameter by generating a sample waveform that "ramps" from a first voltage, such as 50 Volts to second voltage, such as 100V smoothly at a constant rate of change, such as 10V per second, until the equipment under test operates. Another interesting feature relates the capability of stepping a parameter. For example, a frequency might be adjusted to 50 Hz, 50.1, 50.2 and so on, with each frequency persisting for $\frac{1}{10}^{th}$ of a second. Yet another interesting feature of the instructions relates to the capability to provide pulsing, which is similar to ramping except that the parameter goes to some fixed value (such as zero amplitude) for a defined period of time between values, rather than stepping directly from one value to the next. Still another interesting feature relates to the capability to perform complex operations, such as non-linear ramps and binary searches.

Since the instrument is required to evaluate the timing accuracy of the operation of the equipment under test, such as protective relays, these parameter-adjustment algorithms must be performed by the instrument in a way that results in precisely-timed changes to the generated sample waveforms.

Another interesting feature relates to the instrument having the capability to alter parameters with the following desirable characteristics: Precise timing of the generated waveform adjustments; Accommodation of complex parameter-alteration algorithms; Flexibility to allow a wide variety of algorithms to be employed without changing the firmware loaded on the instrument. Conception, implementation and deployment of a new algorithm may be accomplished without requiring users to update the firmware in the test instrument.

FIG. 1 is a block diagram of an example of a relay and metering test instrument in communication with a testing computer and one or more pieces of power equipment under test. In FIG. 1, the relay and metering test instrument 100 is in communication with a testing computer 102 executing testing software 104 stored in a memory circuitry 106. The testing software 104 may be executed by processor circuitry 108 on the testing computer 102 to provide a test technician with a user interface to the relay and metering test instrument. The testing computer 102 may be, for example, a laptop personal computer, a tablet, a mobile phone, or any other device or system having a user interface, such as a keyboard, display screen, and the like, which is configured for bi-direction wireless or wired communication with the relay and metering test instrument 100.

The relay and metering test instrument 100 may provide diagnostic testing of equipment under test 112, which may be protective equipment such as relays, transformers, meters and any other equipment within an electric power system used to monitor and safeguard operation. Protective equipment of the type tested with the relay and metering test instrument 100 is referred to herein as "protective relaying equipment" or "protective relay(s)." Diagnostic testing with the relay and metering test instrument 100, however, is not limited to digital, mechanical and/or electromechanical protective relays, since other monitoring devices and systems including instrument transformers, such as current/potential transformers, power system disturbance detection and/or analysis devices, and other types of systems/devices may detect and/or take appropriate action when abnormal and/or intolerable power system conditions are present.

The diagnostic testing performed by the relay and metering test instrument 100 may include viability/assessment testing such as relay scheme verification, digital logic testing, detection of predetermined conditions, confirmation of operation, accuracy assessment, timing, and functionality testing. The relay and metering test instrument 100 may be used by power utilities and others to protect equipment and facilities related to the transmission, distribution and usage of AC or DC electrical power. During operation, protective relaying equipment may monitor current and voltage waveforms being generated, conducted and/or used by the equipment or facilities being protected. In addition, such protective relaying equipment may extract characteristics from the monitored waveforms, such as the amplitude, phase angle and frequency of those waveforms' AC components. Also, such protective relaying equipment may interpret the extracted characteristics to trigger actions such as opening switches or circuit breakers to isolate protected equipment or facilities from electrical power, in order to avoid or minimize damage or undesirable conditions. Those actions may be referred to herein as "operation" of a relay output, such that an action triggered by a protective relay, may be described as a circumstance where the relay has "operated" or "operates."

The relay and metering test instrument 100 may test aspects of protective relaying equipment by generation of current and voltage waveforms simulating conditions that could be experienced/observed by the protective relaying equipment in various scenarios. Such scenarios, may include, for example, fault conditions that occur due to short circuits, broken conductors or damaged equipment. Current and voltage waveforms may be emitted by the relay and metering test instrument 100 in the form of electrical current and voltage (using voltage amplifiers and current amplifiers), or as digital data such as IEC 61850 Sampled Values for receipt by the protective relaying equipment under test. The relay and metering test instrument 100 may monitor one or more outputs of the protective relaying equipment to, for example, determine whether the equipment under test triggered an event, such as the opening of a breaker in a correct and timely manner. "Outputs" of a protective relay(s) may include physical outputs, such as a contact closure(s) or change in an output voltage or current, or may be a digital output such as setting one or more bits in a data stream, or otherwise digitally communicating to trigger an event.

Generation of current and voltage waveforms by the relay and metering test instrument 100 may include real-time control and adjustment of dynamic parameters used to define each of the waveforms being generated. Parameters for each waveform output may include: amplitude (volts or amperes); phase angle, relative to a reference; and frequency. For complex waveforms generated by the relay and metering test instrument 100, such as those involving harmonics, multiple sets of amplitude, phase and frequency can be used by the relay and metering test instrument 100 to generate multiple waveforms. The relay and metering test instrument 100 may sum the multiple waveforms generated to produce a combined waveform for output to, for example, protective relay(s).

The parameters may be altered by the relay and metering test instrument 100 in various ways during a test. For example, the relay and metering test instrument 100 may generate a test waveform having a smoothly ramping parameter, such as a voltage. For example, a waveform may be generated during testing that "ramps" from 50 Volts to 100 Volts smoothly, where smoothly, in this example is a constant and linear rise in voltage at a rate of 10V per second until the protective relay operates. In another example, the relay and metering test instrument 100 may generate a waveform having a stepping a parameter. For example, a parameter such as frequency might be adjusted to 50 Hz, 50.1 Hz, 50.2 Hz, and so on, with each frequency persisting for defined time, such as $1/10^{th}$ of a second. In yet another example, the relay and metering test instrument 100 may generate a waveform having a pulsing parameter. In the example of a pulsing parameter, the pulsing may be similar to ramping except that the parameter goes to some fixed predetermined value (such as zero amplitude) for a defined period of time between values, rather than stepping directly from one value to the next. In still another example, the relay and metering test instrument 100 may vary parameters using complex algorithms, such as non-linear ramps and binary searches to generate the test waveforms. The relay and metering test instrument 100 may evaluate the timing accuracy of the protective relay's operation during such testing. Accordingly, the relay and metering test instrument 100 performs parameter-adjustment in a way that results in precisely-timed changes to the generated waveforms.

The example relay and metering test instrument 100 in FIG. 1 includes application processor circuitry 116, real-time processor circuitry 118, memory circuitry 120, and input/output processor circuitry 122. The application processor circuitry 116 may manage and control the functional operation of the relay and metering test instrument 100. For example, the application processor circuitry 116 may include executable firmware that provides a communication interface with the testing computer 102. In addition, the executable firmware may provide an interface with the memory circuitry 120. The memory circuitry 120 may be a shared or arbitrated memory that is accessible by the real-time processor circuitry 118 and the input/output processor circuitry 122. The real-time processor circuitry 118 may be in communication with the input/output processor circuitry 122 via one or more communication busses 124. In an example, the application processor circuitry 116, real-time processor circuitry 118, and input/output processor circuitry 122 may be separate, distinct, and independently operational processor circuitry. For example, in a system on a chip (SOC) configuration, the application processor circuitry 116 may be a quad core ARM, the real-time processor circuitry 118 may be a dual core ARM, the memory circuitry 120 may be a DRAM, and input/output processor circuitry 122 may include an FPGA.

The real-time processor circuitry 118 administers the diagnostic tests performed by the relay and metering test instrument 100 by, among other things, coordinating with the input/output processor circuitry 122 over the communication bus 124 to generate test waveforms during a test state. Operation of the real-time processor circuitry 118 to perform a test routine 130 in a test state may be based on execution of any of a number of different and independent test routines 130 stored in the memory circuitry 120. Each of the test routines 130 may include one or more different testing stages 132 that together represent at least part of a respective test state. For example, an overcurrent protective relay may be cycled through the test states of pre-fault condition where balanced current conditions are simulated, a fault condition where a three-phase or single-phase fault current conditions are simulated, and a post-fault condition where balanced current conditions are again simulated after an event, such as opening a circuit breaker to eliminate the fault. During a test state, one or more test routines 130 may be executed.

The relay and metering test instrument 100 may include any number of test routines. Accordingly, any number of test routines 136 may be stored in the memory circuitry 120, with each of the test routines 136 having any number of respective testing stages 132. Pointers 136 may be stored in the memory circuitry 120. The pointers 136 may identify a location of a respective test routine 130. The test routines 130 may be generated and stored in the memory circuitry 120 in an overlay database 140 by the application processor circuitry 116. The application processor circuitry 116 may also generate and store the pointers 136 in the memory circuitry 120 in a pointer database 142. The memory circuitry 120 may be a shared memory, such as a random-access memory (RAM) that is accessible by the application processor circuitry 116, the real-time processor circuitry 118 and the input output processor circuitry 122. Execution, by the real-time processor circuitry 118, of testing stages 132 in a respective overlay 130 may be coordinated with operation of the input output processor 122.

The application processor circuitry 116 may receive, from the testing computer 102, a source code state program selected by a user, and operational parameters received as inputs from the user. The application processor circuitry 116 may compile the source code state program and the operational parameters into a test routine 130. The test routine 130 may be stored in the overlay database 140 in the memory circuitry 120 with a number of other test routines 130, which are accessible by the real-time processor circuitry 118. In addition, the application processor circuitry 116 may generate pointers 136 identifying locations of respective test routines 130. The pointers 136 may be stored in the pointers database 142 in the memory 120 to be accessible by the input/output processor circuitry 122. The real time processor circuitry 118 may selectively execute test routines 130 according to pointers 136 provided by the input/output processor circuitry 122. The pointers 136 may be provided by the input/output processor circuitry 122 at the time input/output processor circuitry 122 instructs the real time processor circuitry 118 to transition to another test routine 130.

The input/output processor circuitry 122 may generate waveforms for output to the equipment under test 112. The waveforms may be sinusoidal waveforms generated by the input/output processor circuitry 122 from waveform generation parameters calculated by the real-time processor circuitry 118. In addition, the input/output processor circuitry 122 may receive and process input triggers received from the equipment under test 112. The input triggers may be used by the input/output processor circuitry 122 to control the respective test routines 130. The equipment under test may be, for example, one or more protective relays that sense voltage and/or current and output an output signal. For example, an overvoltage or overcurrent relay may output an over voltage/overcurrent indication, such as a digital output, a contact closure, or an analog output.

Figure 2:
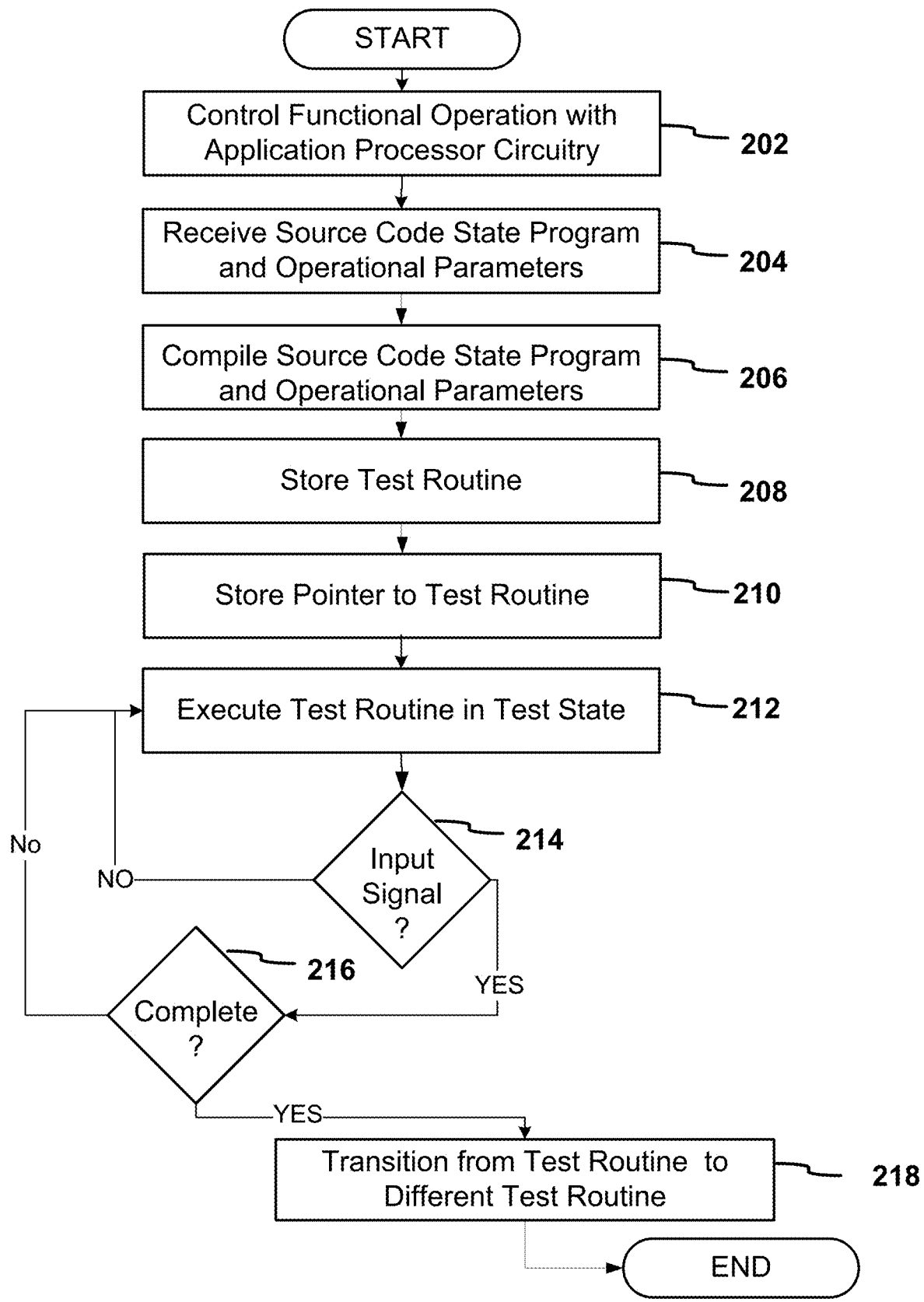
FIG. 2 is an example of an operational flow diagram for a relay and metering test instrument.

FIG. 2 is an example of an operational flow diagram for a relay and metering test instrument 100. With reference to FIGS. 1 and 2, the operation starts with the application processor circuitry 116 controlling functional operation of the relay and metering test instrument 100 (202) to perform a test routine in a test state. Control of functional operation may be performed with firmware executed by the application processor circuitry 116 to, for example, manage communication, control the user interface, compile source code and operational parameters(s), manage operational parameters, manage database(s), manage data storage in the memory circuitry 120, and the like.

The application processor circuitry 116 may receive a source code state program selected by a user, and operational parameters received as inputs from the user as part of a complete state sequence (204). The complete state sequence may include state definitions for each state or test state. The test states may be a series of states in the state sequence of a complete test. Each of the states may include transitions between states. The source code state program may be one of a number of different source code files, such as a C-language source code files, representative of a portion of a respective state definition in a state. The state definitions of the respective states in a state sequence may also include, for example, waveform generation parameters such as amplitude, phase angle, frequency, for test state functionality, which is not part of the test routines being controlled by the real-time processor 118. Other example test functionality that may be included in the state definitions includes maximum duration for the state; index(s) providing transition to another state if a maximum duration is reached; other state index values that may become active under pre-specified conditions; an "inherit" Boolean value, which if true causes any value not defined for a given state to remain as it was in the previous state rather than changing to a default value; definition(s) of outputs such as binary/logic/contact outputs that may be set to a particular state during the particular state; sets of waveform sample data that may be played back, for cases where, for example, simple sinusoidal waveforms aren't appropriate; trigger definitions, indicating which inputs and other events will be processed into numbered trigger events; definition(s) of state transitions that may occur if a certain trigger event occurs, without any interaction with the real-time processor 118; and the like.

The source code state program may be waveform parameter-alteration algorithms, such as smooth ramp, stepped ramp, pulsed ramp, binary search and multiple-parameter ramp source code used to generate waveform parameters. Operational parameters received as inputs from the user with the source code state program may be static operational parameters corresponding to the selected source code state program. The static operational parameters may include, for example, start and end parameters such as thresholds, setpoints, time periods and other variables that configure aspects of the respective test routine. The static operational parameters may also include "trigger" selections, which, as further described elsewhere, are related to the way events are communicated between the input/output processor circuitry 122 and the real-time processor circuitry 118 over the communication bus 124. Any of the number of different source code state program files may be available and selectable by a user via the user interface provided on the testing computer 102. In addition, one or more of the static operational parameters for a selected source code state program may be input via the user interface in the testing computer 102.

The application processor circuitry 116 may compile the source code state program and the static operational parameters into a test routine 130 (206). The test routine 130 may be, for example an object file having a header that includes the static operational parameters. In other examples, other types of file structures may be used. Each time an operational parameter is updated by receipt of a user input, for example, the source code state program and the static operational parameters may be compiled into the test routine 130.

The test routine 130 may be created by the application processor circuitry 116 firmware in response to commands from the user's testing software executed on the test computer 102. The testing software executed on the test computer 102 may provide a message containing operational parameter names and values. The application processor circuitry 116 may package the parameter names and values in a predetermined format. For each operational parameter, the application processor circuitry 116 may generate an "undef" macro, to undefine a default value that's defined in the test routine 130. In this way, any static parameters the user's test software and the test computer 102 provides may be used, and any parameters not provided may have default values. The application processor 116 may then "re-define" each parameter to set the value of the static parameter according to the value provided in the test routine 130. Values may be presented in the test routine 130 as static parameters in an appropriate form to initialize a variable of the appropriate type for the particular parameter (integer, double value, boolean, etc.). Conversion functions may be defined in a header to scale values according to a type of the parameter. That way parameter initializers such as amps (10) or Hz (60) result in values that may be typed and scaled correctly.

For example, if the test routines may expect voltages to be in fixed-point integer format with 16 fractional bits, the conversion function may multiply the given voltage value by 65536 and retain only the integer portion of the result. If the user's test software sends an incorrect parameter name, that parameter may still get generated as undef/define static parameter, but those parameters may be ignored by the test routine processor circuitry 118. With specific static operational parameters, such as in the example shown below: arrays in the test routines code may be sized to allow simultaneous ramping of up to four separate parameters. In the below example, input trigger 5 may be used to sense the operation of an equipment under test, such as a relay being tested.

undef param_maximumRampCount
define param_maximumRampCount 4
undef param_inputTriggerNumber
define param_inputTriggerNumber 5

The application processor circuitry 116 may compile the source code and static parameters to generate an object file. The object file may then be stored the test routine 130 in the memory circuitry 120 (208). The test routine 130 may be stored with any number of other test routines 130 in the memory circuitry 120. A memory location in the memory circuitry 120 of the test routine may be accessible by the real-time processor circuitry 118. The real-time processor circuitry 118 may selectively and independently execute the test routine 130 or one of the other test routines 130 to perform a plurality of respective testing stages 132 when directed by the input/output processor circuitry 122. Writing of the test routine 130 to the memory circuitry 120 (after compilation to generate the object file) may be executed by the application processor circuitry 116 while the real-time processor circuitry 118 is executing one of the other test routines 130. The just compiled object file may be loaded as the test routine 130 into a RAM area in the memory circuitry 120 that's always accessible to the application processor circuitry 116 and the real-time processor circuitry 118. The specific RAM area where the just compiled object file is stored as the test routine 130 may only get modified while the real-time processor circuitry 118 is not accessing that specific RAM area (between tests, or while generating another test routine other than the one that's being updated with the just compiled object file). The real-time application processor 118 may update its function pointer when a new pointer 136 is provided by a state sequencer included in the input/output processor circuitry 122. The state sequencer may obtain the pointers 136 for all the test routines from another shared RAM area of the memory circuitry 120.

The application processor circuitry 116 may generate a pointer 136 to the memory location in the memory circuitry 120 where the test routine is stored (210). The pointer 136 may be stored in the memory circuitry 120 by the application processor circuitry 116. Different pointers 136 may also be stored in the memory circuitry 120 for each of the other test routines stored in different memory locations in the memory circuitry 120.

The test routine 130 may be executed by the real-time processor circuitry 118 when test state that includes the test routine 130 is initiated (212). During execution of the test routine 130 by the real-time processor circuitry 118, the input/output processor circuitry 122 may cooperatively operate with the real-time processor circuitry 118 to output test signals to the equipment under test 112. In addition, the input/output processor circuitry 122 may monitor for receipt of input test signals, such as triggers, from the equipment under test 112 or from the real-time processor circuitry 118 (214). If a predetermined input signal is not received, the test routine 130 may continue to execute. If a predetermined input signal is received, the input/output processor circuitry 122 may direct transition, by the real time processor circuitry 118, between execution of the respective test routines 130.

The input/output processor circuitry 122 and/or the real-time processor circuitry 120 may dictate whether the test state being performed by execution of the test routine 130 is complete (216). Completion of the test state may be based on, for example, a predetermined input signal received by the input/output circuitry 122, an elapsed period of time determined by the real-time processor circuitry 120, or some other criteria. If the test state is not complete, execution of the test routine 130 in one or more testing stages 132 may continue. If the test state is determined to be completed, the transition between test routines 130 may be directed by the input/output processor circuitry 122 by providing commands to the real-time processor circuitry 118 that include a pointer 136 to the next test routine 130 (218). The input/output processor circuitry 122 may retrieve the pointer 136 from the memory circuitry 120, and direct the real time processor circuitry 118 to execute a test routine 130 identified with the pointer 136 and the operation ends. In some examples, directing of the transitions between test routines 130 by the input/output processor circuitry 122 may be initiated by other than the input test signals.

Figure 3:
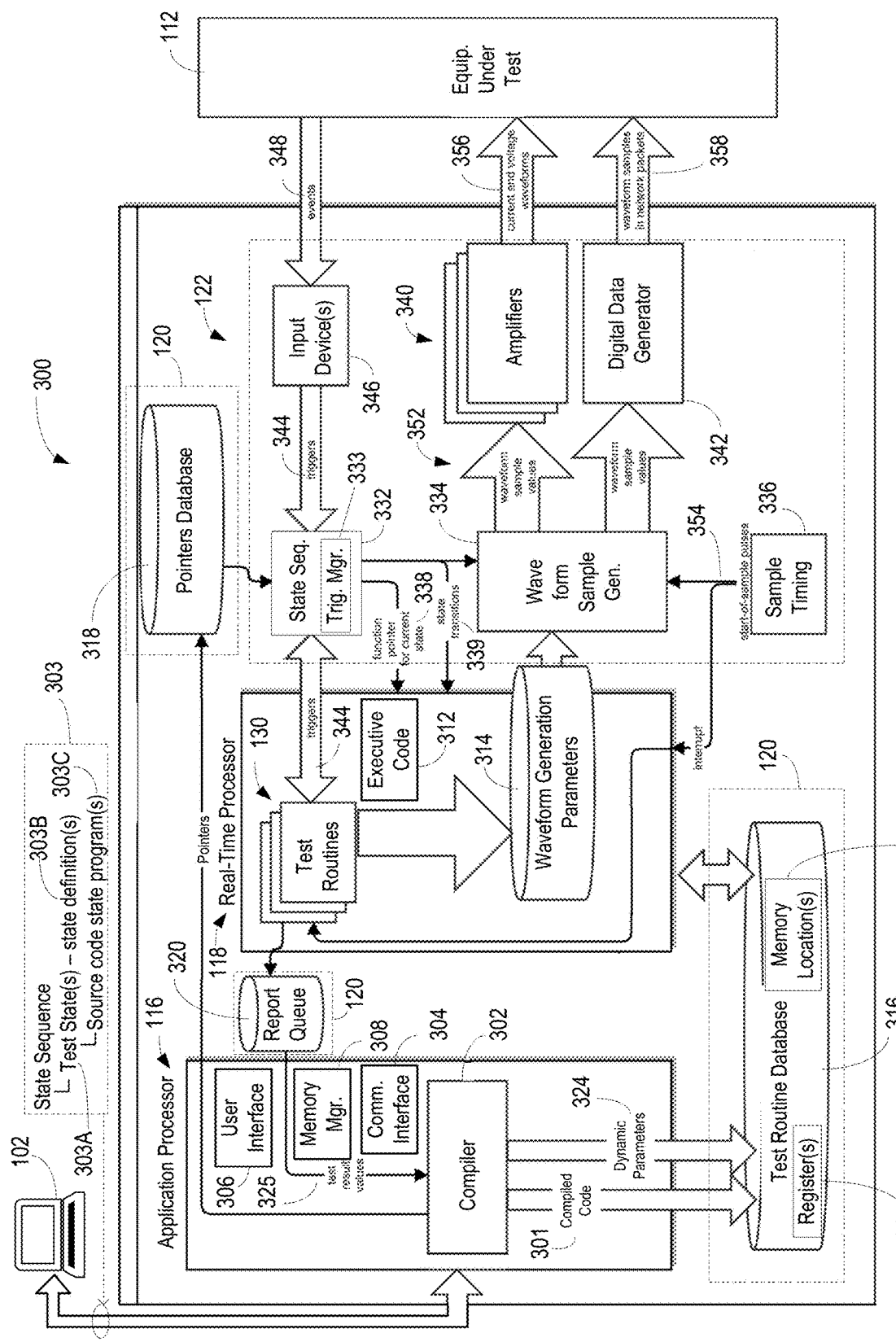
FIG. 3 is a block diagram of an example relay and metering test instrument in communication with a test computer and an equipment under test.

FIG. 3 is a block diagram of an example relay and metering test instrument 300 in communication with a test computer 102 and an equipment under test 112. In this example, the relay and metering test instrument 300 includes the application processor circuitry 116, the real-time processor circuitry 118, the memory circuitry 120, and input/output processor circuitry 122 similar to the relay and metering test instrument 100 discussed with reference to FIGS. 1 and 2. Unless otherwise indicated, the features and functionality of the relay and metering test instrument 100 (FIGS. 1 & 2) are similar. Accordingly, for purposes of brevity the details of these features and functionality will not be repeated, however, it should be understood that such features and functionality are fully interchangeable, combinable, and/or useable in either the relay and metering test instrument 100 or the relay and metering test instrument 300, unless otherwise indicated.

In FIG. 3, the application processor circuitry 116 includes a compiler 302 for compiling the source code state programs and operational parameters received as selections included in a state sequence 303 from the test computer 102. The state sequence 303 may be prepared by a user of the relay and metering test instrument 300 using the test computer 102 and provided to the relay and metering test instrument 300. The user may create a test sequence 303 that includes a series of states as one or more test states 303A having state definitions 303B. Each of the state definitions 303B, may include, among other things, one or more source code state programs 303C. The source code state programs 303C may be compiled as object code, which is stored as a test routine 130 executable within a test state 303A of a state sequence 303. The compiled object code of a test routine 130 may be stored in the test routine database 316 as illustrated by the compiled code line 301.

The application processor circuitry 116 also includes a communication interface circuitry 304, a user interface circuitry 306 and a memory manager circuitry 308. The communication interface 304 may include functionality providing wired or wireless communication with the test computer 102. In addition, communication with the real-time processor circuitry 118 and the input/output processor circuitry 122 may be handled via the communication interface 304. The user interface 306 may provide functionality to drive visual indicators, such as lights, readouts, and/or displays and the like, and receive user input signals such as button press signals, touch screen signals, images, and the like which may be initiated by a user from hardware such as buttons, switches, a touch screen, a camera, a sensor or any other mechanical user interface included on the relay and metering test instrument 300. The memory manager circuitry 308 may manage arbitration of the shared memory circuitry 120, and may include database management capability, multi-level secure access management for authorized users and the like.

Referring to FIGS. 1-3, the real-time processor circuitry 118 may include executive code 312 to manage execution of the test routines 130. In addition, the real-time processor circuitry 118 includes a waveform generation parameters buffer 314 for waveform generation parameters generated and altered by a test routine being executed during a test state 303A. Waveform generation parameters may be dynamically calculated by a respective test routine 130 in one or more testing stages 132 of the test routine 130. In an example, the waveform generation parameters are phasor values (amplitude, phase angle, frequency, and the like). The waveform generation parameters may be dynamically changed or adjusted by the real-time processor circuitry 118 during a test state 303A, during a testing stage 132, when transitioning between testing stages 132 or when transitioning between test routines 132. The waveform generation parameters 314 may be dynamically changed as the relay and metering system proceeds through the test routine 130 based on predetermined times, logic conditions and/or events occurring during the test routine 130 and/or during the test state 303A. In addition, the waveform generation parameters 314 may be dynamically changed by receipt of dynamic operational parameters that are input by a user, such as in the test computer 102.

The executive code 312 may be a firmware program executable with the real-time processor circuitry 118 to manage activation, deactivation control and execution of the test routines 130. Each test routine 130 may reside an overlay, which becomes active when appropriate based on the sequencing of test states 303A in a respective test sequence 303 during a test. Sequencing of the test states 303A in a test sequence 303 may be controlled by the input/output processor circuitry 122 based on, for example, triggers and timers to transition between the test states 303A and/or between the test routines 130 within a test sequence 303 using pointers 136 stored in the memory circuitry 120.

The memory circuitry 120 may include a test routines database 316, a pointers database 318 and a report queue 320. The test routines database 316 may store the test routines 130 in association with one or more memory locations 322. The source code state programs, which are selectable by a user as part of one or more test states 303A in a state sequence 303, and compiled to generate the test routines 130 may also be stored in the test routine database 316. The stored source code state programs may be provided to the test computer 102 for selection by a user when creating a state sequence 303. The source code state programs may be stored in the test routine database 316 at the time the firmware executable with the application processor circuitry 116 was developed, tested and released. Alternatively, or in addition, at least some of the source code state programs may be stored in the test computer 102 or accessed with the test computer 102 for selection for inclusion in a test state 303A of a state sequence 303.

The pointers database 318 may include the pointers 136 providing a memory location 322 of each of the test routines 130 in the test routine database 316. The input/output processor circuitry 122 may access the pointers database 318 according to a respective test state 303A to extract corresponding pointers and direct the real-time processor circuitry 118 to execute different test routines 130 as dictated by operation of the test sequence 303 when running through a series of test states 303A during a test. For example, to transition between first and second test states, the input/output processor circuitry 122 may retrieve and provide, to the real-time processor circuitry 118, a respective pointer to a memory location 322 of a test routine 130 in order to direct execution by the real-time processor circuitry 118.

The report queue 320 may store real-time test result values as each test routine 130 is executing testing stages 132 in a particular test state 303A for equipment under test.

For example, in a test routine 130 for a double ramp, in which a waveform ramps down until a protective relay drops out and then ramps back up again until the protective relay picks up, the parameter values of the waveform at the time the relay dropped out may be stored and the parameter values of the waveform at the time the relay picks up may be stored as testing stage result values of the respective testing stages 132. The testing stage result values may be calculated, reported, interpreted and stored by the real-time processor circuitry 118. Calculation, reporting and interpretation of the testing stage result values may include analysis of differences in expected operation of the equipment under test vs. actual operation of the equipment under test. Accordingly, the real-time processor circuitry 118 may capture, calculate, report, interpret and store time-based situational aspects in the report queue 320 as a test state 303A unfolds, as illustrated in FIG. 3 by a test report values line 325. The time-based situational aspects may be captured, calculated and stored while testing stages 132 of a particular test routine 130 is executed and input(s) and output(s) of the input/output processor circuitry 122 are occurring.

In addition to the static operational parameters compiled in a header file with a selected source code state program 303C, dynamic operational parameters may also be conveyed by the application processor 116 and stored in memory circuitry 120, such as in registers in the test routine database 316. The registers containing dynamic operational parameters may be updated based on new operation parameters input by a user during a test in which a test routine 130 is executing. For example, the user interface of the testing computer 102 may allow a user to manually adjust a ramp rate of a waveform during ramping of the waveform by a ramping test routine 130 by changing dynamic operational parameters using push buttons. Thus, the application processor circuitry 116 may update the storage location of the dynamic operational parameters of the ramping test routine 130 with a new operational parameter input by the user during execution of the ramping test routine 130 as illustrated with the dynamic line 324. The real-time processor circuitry 118 may retrieve the newly stored operational parameter from the memory circuitry 120 during execution of a testing stage 132 included in the ramping test routine 130. In an example, the dynamic operational parameter may be retrieved from one or more register(s) 326 in the memory circuitry 120, by the real time processor circuitry 118 while executing one or more testing stages 132 of the ramping testing routine 130. The registers 326 may be one or more predetermined blocks of memory storage location(s) that are writeable by the application processor circuitry 116 and readable by the real-time processor circuitry 118 during execution of the ramping test routine 130 by the real-time processor circuitry 118.

The input/output processor circuitry 122 may include a state sequencer 332, a waveform sample generator 334, and a sample timing generator 336. The state sequencer 332 may control progression through a series of the test states 303A in a state sequence 303. In addition, to determining the current test state 303A that a particular test sequence 303 should be in, the state sequencer 332 may also identify the respective pointer 136 in the pointers database 318 for a respective test routine 130 included in the test state 303A that should be executed as part of the test. The state sequencer 332 may extract and pass the pointer 136 to the real-time processor circuitry 118. In the example of FIG. 3, the pointer 136 for the test routine 130 in the current test state 303A is passed to the real-time processor circuitry 118 via a function pointer line 338, and a test state number of the current test state 303A is passed to the real-time processor circuitry 118 via the state transition line 339. Thus, when the state sequencer 332 elects to transition from a first test state 303A to a second test state 303A in a respective test sequence 303, the function pointer line 338 carries the pointer for a test routine 130 in the second test state 303A, and the state transition line changes from the first test state 303A to the second test state 303B, such as from #1 to #2.

The state sequencer 332 also includes a trigger manager 333 to manage incoming and outgoing triggers 344 as illustrated by arrows in FIG. 3. Outgoing triggers 344 from the state sequencer 332 may be provided to a respective test routine 130 to, for example, initiate some action or change in the testing stages 132 of a test routine 130. For example, in the case of a double ramp test routine 130, a waveform may be ramping in a first direction through one or more testing stages 132 until the test routine 130 receives an output trigger from the state sequencer 332 to execute one or more testing stages 132 to reverse the direction of the ramp to a second direction. Incoming triggers to the trigger manager 333 may be provided from input devices 346 upon receiving events 348 from equipment under test 112. Input devices 346 may be opto-isolators, ND converters, dry contacts, wet contacts and/or any other signal conversion or conditioning device or system receiving signals from an equipment under test 112.

Events 348 may be a predefined condition, such as, for example, a contact closure in a protective relay, or a voltage reaching a predetermined threshold, or the like. Example events include an overcurrent protective relay closing a contact when an overcurrent condition is reached, or a frequency protective relay sensing a frequency and providing a representative signal outside a predetermined acceptable range. Incoming triggers 344 may also be provided to the state sequencer 332 by testing stages 132 in the test routines 130. For example, a test routine 130 executing in a testing stage 132 may generate one or more incoming triggers 344 related to the progress of the testing stage 132. For example, one or more incoming triggers 344 may be generated when a protective relay fails to sense an event when a generated waveform reaches a predetermined condition.

Each of the incoming triggers 344 may be identified by a unique identifier known to the state sequencer 332. In addition, each of the outgoing triggers provided to the real-time processor circuitry 118 may be identified by a unique identifier so that the respective test routines 130 may receive, process and react appropriately to outgoing triggers received from the state sequencer 332. Alternatively, or in addition, triggers 344 to and from the test routines 130 may be stored in the registers 326 or other predetermined storage locations in the memory circuitry 120 that are accessible by both the real-time processor 118 and the input/output processor 122. Accordingly, as a test routine 130 is revised by revisions to the corresponding source code state program 303C, the interface between the trigger manager 333 and the test routine 130 may remain intact and fully operational. In addition, if the triggers 344 passing between the test routine 130 and the trigger manager 333 are changed as part of the revisions to the test routine 130, pre-determined indexing and predetermined assigned storage locations indexed to the triggers may be used such that changes to the functionality of the state sequencer 332 and/or the trigger manager 333 may be avoided. Accordingly, more extensive updates to the firmware supporting the state sequencer 332 and the trigger manager 333 as well as the other functionality outside the test routines 130 may be avoided when one or more of the test routines 130 are updated.

Determination by the state sequencer 332 of a beginning and an end of respective testing stages 132 and/or respective test routines 130 and or test state 303A may be rules-based determination using predetermined rules that align with the triggers 344 and trigger conditions. The trigger conditions may be a current status of incoming triggers 344 received by the state sequencer 332 and outgoing triggers 344 generated by the state sequencer 332. The state sequencer 332 may receive triggers 344 from any number of input devices 346 and testing routines 130. In addition, each of the input devices 346 may generate one or more separate and distinct incoming triggers 344 according to event(s) 348.

The waveform sample generator 334 may receive waveform generation parameters 314 from a particular testing routine 130 and generate waveforms therefrom. For example, the waveform sample generator 334 may receive phasor values for one or more waveforms, which may be summed to generate more complex waveforms, such as waveforms with superimposed harmonics, or other complex features. The waveform generation parameters 314 may be dynamically changed by the testing stages 132 of the test routine 130 during a test as part of the test state. In addition, the waveform generation parameters 314 may be dynamically changed during testing stages 132 by receipt of dynamic operational parameters that are input by a user and stored in the registers 326. Thus, during a particular test that includes execution of a test routine 130, the waveform generators may be receiving changing phasor values, such as amplitudes, phase angles, frequency and the like that coincide with the particular testing stage 132 of the test routine 130. Since the real-time processor circuitry 118 is also receiving triggers, pointers, and state transitions, time synchronization of waveform changes may be precisely controlled. Parallel processing of the generation of waveform generation parameters and processing of triggers, pointers, and state transitions in the testing stages 132 avoids sequential processing and related lag time and delays, and allows for precise timing of dynamic adjustments of the generated waveform samples.

The waveform sample generators 334 may output waveform sample values 352 to any number of different amplifiers 340 included in the input/output processor circuitry 122 as illustrated by arrows. The amplifiers 340 may be current amplifiers, voltage amplifiers or both. The waveform sample values 352 may be used to drive the amplifiers 340 to output desired current and voltage sine waves 356 to simulate desired test conditions for equipment under test 112. In addition, or alternatively, the waveform sample values 352 may be provided to a digital data generator 342. The digital data generator 342 may convert the waveform sample values 352 to digital information. The digital information representing the waveform sample values 352 may be organized in data packets 358 for transmission over a network to the equipment under test 112. Amplifiers 340 and digital data generator 342 and transmission via a network are representative ways of conveying the waveform sample values. Other conveyance platforms may be used to provide the equipment under test 112 with simulation of different waveforms for purposes of testing.

The sample timing generator 336 may be a time source to coordinate operation of the real-time processor circuitry 118 and the input/output processor circuitry 122. Thus, the operation of the test routines 130, including stepping through a number of different testing stages 132, may be based on receipt of the interrupts. For example, the test routine 130 may enter a different testing stage 132 each time an interrupt is received. Alternatively, or in addition, the test routine 132 may, for example, remain in a testing stage 132 for a predetermined number of interrupts, until either a trigger is received or a determined number of interrupts are received, or any other timing/logic to provide the desired test situation/scenario for a test state 303A. Desired test situation/scenarios may include, for example, the correct waveform generation parameters 314, generation of trigger(s) 344 in synchronism with the other processor circuitry, and the like. Thus, not only do the interrupts cause the test routine 130 to execute test stages 132, or take no action, the interrupts also provide synchronization with operations related to the application processor circuitry 116 and the input/output processor 122. For example, execution of a respective different testing stages 132 of a test routine 130 to generate waveform generator parameters may be synchronized with the waveform sample generators 334 using the interrupts.

In FIG. 3, sample pulses may be output as a pulse train on a sample pulses interrupt line 354 to operate as an interrupt for the test routine 130. The interrupts received by the real-time processor 118 may cause a presently executing test routine 130 to transition to another testing stage 132, poll registers 126, check for triggers 344 from the state sequencer 332, pause and take no action, and the like. In addition, the interrupts may cause the real-time processor 118 to initiate execution of the test routine 130 to dynamically generate waveform sample values with the waveform sample generator 334. In an example, the sample timing generator 336 may generate a 48 kHz pulse train. Also, the sample timing generator 336 may be synchronized or disciplined to a time source.

During example execution, a test routine 130 may respond to an interrupt that occurs at the waveform sample generation rate (for example 48 kHz), by performing calculations based on a count of the interrupts received from the sample timing generator on the sample pulses line 354. In addition, the real-time processor circuitry 118 may execute the test routine 130 to dynamically calculate waveform generator parameters, such as amplitude, phase angle and frequency parameters, according to the testing stage 132 and/or the phase of a test state being executed and/or dynamic operational parameters received as inputs from a user. The waveform generator parameters may be written into the waveform generation parameter buffer 314 and stored in, for example, registers in the input/output processor circuitry 122. The input/output processor circuitry 122 may include sample generation logic in the waveform sample generator 334, which may use the parameters to generate waveforms as waveform sample values 352.

The test routines 130 may respond to changes in the states of outgoing triggers or incoming triggers. Triggers 344 may, for example, be in the form of trigger bits, which may be a single bit that toggles to indicate a change, or more than one bit that provides a trigger message indicative of the change. The outgoing triggers may be provided by the state sequencer 332 of the input/output processor circuitry 122. The outgoing triggers may be bits that responsively change state during a test state 303A, such as, for example, in response to a relay operation. Each test routine 130 may use the outgoing triggers in any desired fashion. For example, a binary-search test routine 130 may decide whether a given waveform pulse or waveform stop threshold should be higher or lower than the previous one, based on whether the equipment under test 112 operated during the previous pulse or step, and what was the nature of the operation.

The real-time processor circuitry 118 may also produce triggers, such as "trigger" bits, by writing triggers 344 to registers accessible to state sequencer 332 in the input/output processor circuitry 122. Such input triggers from the real-time processor circuitry 118 may indicate, for example "relay operated at the correct time", "relay operated at an inappropriate time", or "relay did not operate within the allowed time limit". The state sequencer 332 may, for example, use the incoming triggers from the real-time processor circuitry 118 to decide whether to direct the real-time processor circuitry 118 to make a transition from one test state 303A to another test state 303A during a state sequence 303 or change testing stages 132 within the test routine 130 of the present test state 303A.

The real-time processor circuitry 118 may also write report values to the report queue buffer 120, which is accessible to application processor circuitry 116. The application processor circuitry 116 may provide the report values to the test computer 102 as result data. For example, if a phase angle of a simulated waveform is ramped from 90 to 120 degrees, and a phase angle protective relay operates at a test stage 132 when the phase angle is 100 degrees, the test routine 130 may write 100 degrees as a result value in the report queue buffer 120 to that test stage 132 and/or for the test routine 130.

Figure 4:
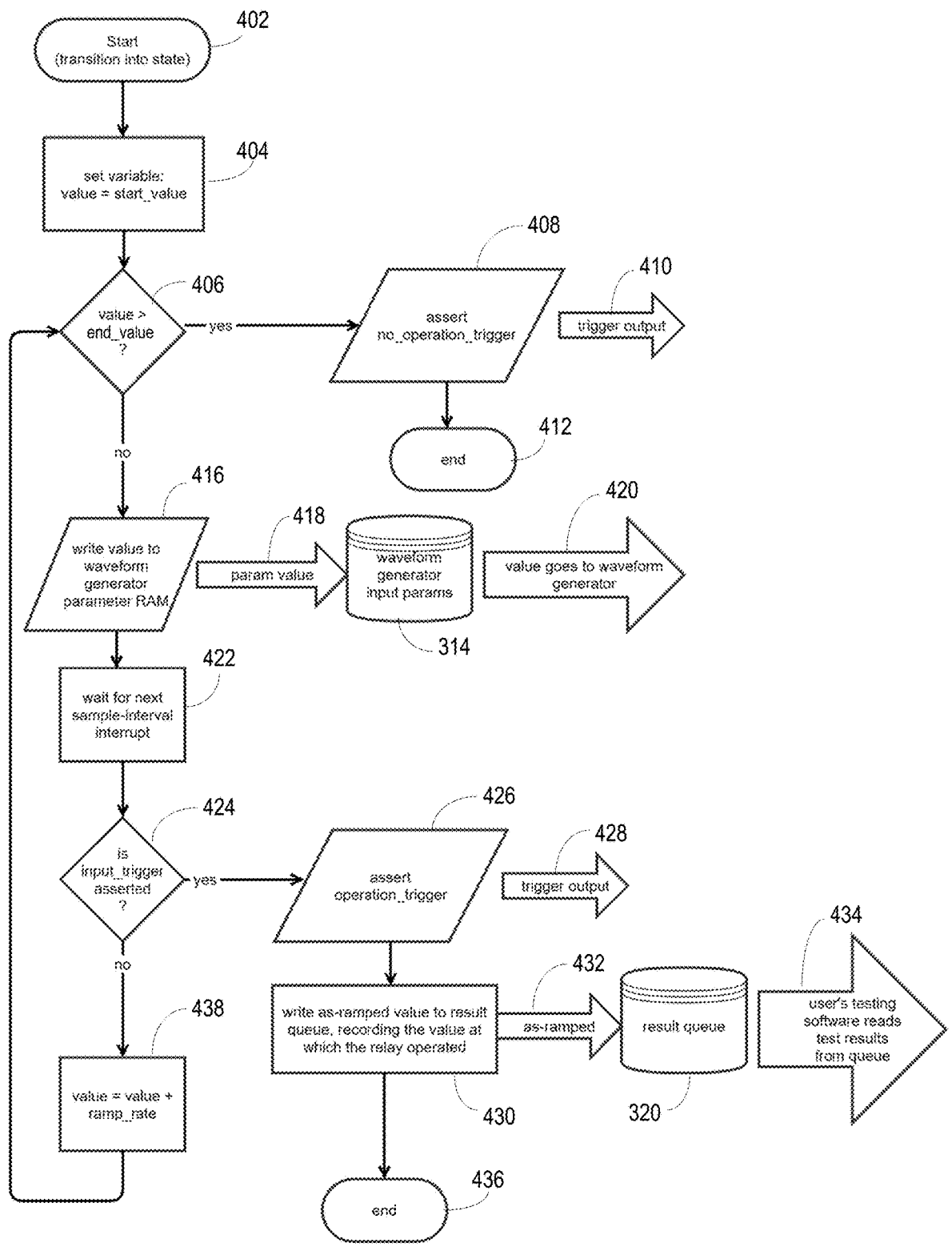
FIG. 4 is an operational block diagram of an example of execution of a test routine.

FIG. 4 is an operational block diagram of an example of execution of a test routine. With reference to FIGS. 3 and 4, in this example, the test routine 130 is a ramped test routine executed by the real-time processor circuitry 118 to provide a ramped waveform via the waveform sample generator 334. In summary, the ramped test routine 130 sets a waveform amplitude to a start value, then enters one or more different test stages 132 and ramps the amplitude of the waveform up at a defined rate until either the connected equipment under test, such as a relay, operates or the ramp reaches a defined end value.

The example operation begins when the ramped test routine is executed by the executive code 312 operating as firmware in the real-time processor circuitry 118. The real-time processor circuitry 118 is directed to transition to a test state 303A that includes the ramped test routine 130 by the input/output processor circuitry 122 providing a current state on the current state line 338 and a state transition number on the state transition line 339 (402). Once in the test state, the controlled waveform generation parameter values are set equal to the static operational parameter values (start_value) included in the header of the object file when the source code state program 303C representing the ramp test routine 130 was compiled by the application processor circuitry 116 (404). The start ramp value may be a waveform amplitude, such as 50 Vac having a ramp of, for example, 1 volt/second, to an end ramp value, such as 80 Vac. The real-time processor circuitry 118 determines if the ramp value is greater than a value (end_value) at which the equipment under test is expected to operate (406). If yes, the real-time processor circuitry 118 executes the ramp test routine 130 to assert that the equipment under test did not operate (no_operation_trigger) (408), sends a trigger output from the real-time processor circuitry 118 for receipt as a trigger input to the state sequencer 332 (410), and ends execution of the ramp test routine 130.

If the ramp value is not greater than the value at which the equipment under test is supposed to operate (408), the real-time processor circuitry 118 may generate waveform generator parameter(s) (416), and provide to the input/output processor circuitry 122 via the waveform generation parameters buffer 314 (418). The input/output processor circuitry 116 may, for example, extract the waveform generation parameters from a memory location, and provide the parameters to the waveform sample generator 334, which provides waveforms or waveform samples to the equipment under test (420). The real-time processor circuitry 118 may then wait for the next sample-interval interrupt from the sample timing generator 336 (422).

The real-time processor circuitry 118 may determine if the event has occurred upon receipt of the sample interrupt by checking if an output trigger from the state sequencer 332 has been provided as an input trigger to the real-time processor (424). If yes, the real-time processor circuitry 118 executes the ramp test routine 130 to assert that the equipment under test did operate (operation_trigger) (426), and sends a trigger output from the real-time processor circuitry 118 for receipt as a trigger input to the state sequencer 332 (428). In addition, the real-time processor circuitry 118 calculates and records test result values including the as-ramped waveform value and the amplitude value at which the equipment under test, such as a protective relay operated (430). The test result values, including the as-ramped value may be provided to the report queue 320 (432). The testing computer 102 may read test results from the report queue 320 (434). Alternatively, or in addition, the test results may be pushed to the testing computer 102. Execution of the ramp test routine 130 may cease (436).

If the output trigger from the state sequencer 332 has been provided as an input trigger to the real-time processor 118 (424), the real-time processor 118 may increment the amplitude value of the waveform by the ramp rate (438) by providing waveform generation parameters to the waveform sample generator 334. In addition, the real-time processor 118 may determine if the increment caused the amplitude value to exceed the expected amplitude that should cause the equipment under test to actuate and the operation may proceed to repeat some of the previously discussed steps.

Figure 5:
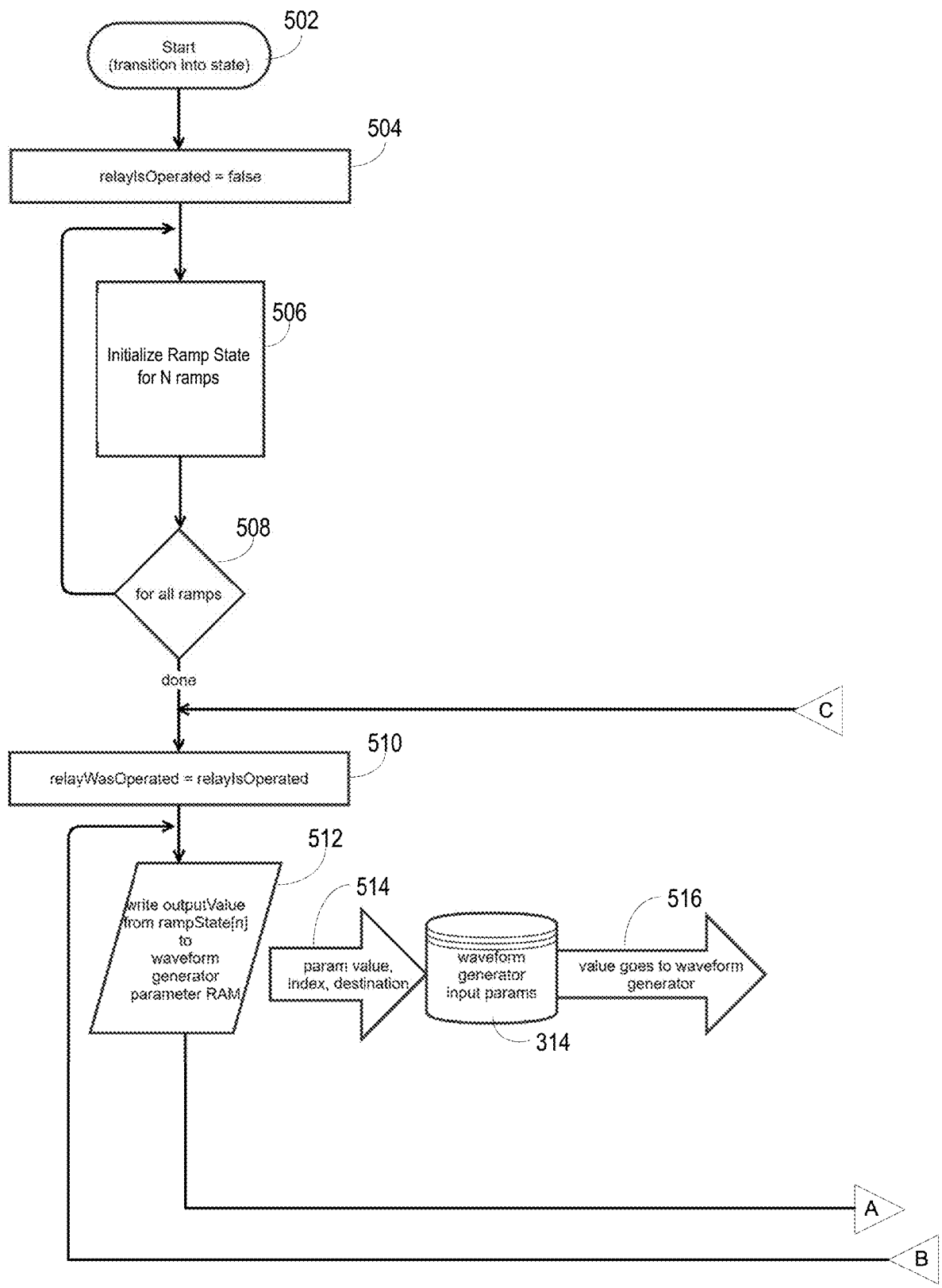
FIG. 5 is a block diagram of another example operation of a test routine for a piece of equipment under test.

FIG. 5 is a block diagram of another example operation of a test routine for a piece of equipment under test. In this example, the equipment under test is described as a relay, however, in other examples, other equipment may be tested. Referring to FIGS. 3 and 5, when executed by the real-time processor circuitry 118, the test routine 130 of this example is a multi-ramp test routine that may execute in parallel a number of waveforms, such as simple ramps, smoothly increasing or decreasing a value for each ramp. The multiple ramp waveforms may be executed in parallel until either the equipment under test, such as a relay being tested, operates, or the user's testing software on the testing computer 102 requests a transition out of the current state. Each time the relay operates, test result value(s) may be enqueued in the report queue 320 for each ramp, namely the as-ramped value at the time when the relay operated is enqueued in the report queue 320. If the relay does not operate, no result values are enqueued. Each ramp optionally includes a trigger index, which may be asserted when the relay operates. In this way the test state may be structured so that a state transition occurs at the time the relay operates for any one of the ramps.

In this example, the source code state program, which is compiled into the test routine 130 may include one or more header files that are parameter definition files generated by the application processor circuitry 116. The header files included in the test routine 130 may include conversion functions, such as a voltage conversion function, and the like. The test routine 130 may also include standardized library headers, to make use of standardized library functions and classes. In addition, the headers of the test routine 130 may define one or more special trigger index values, such as a special trigger index value to monitor for relay operation. In addition, the header file(s) may define default values for some or all static operational parameters. These default values may be used for any static operational parameter that is not defined in the header file.

Each ramp may also operate with a set of dynamic parameters, which may be dynamically adjusted by a user during a test while the test routine is executing. Static operational parameters, on the other hand, are set to fixed values from the header file(s) before the test routine is executed. For example, each of the ramps may include as dynamic operational parameters a start value, an end value and a ramp rate for a value, such as amplitude, being ramped. The ramp rate may be positive or negative, for upward or downward ramps. The respective ramp may stop when it hits either the start value or the end value such that the value of the respective ramp no longer changes. During a test, if the start value dynamically changes due to a user input of a change start value, the ramp may be re-started at that new start value.

Referring to FIGS. 3 and 5, example operation begins when the multi-ramp test routine is executed by the executive code 312 operating as firmware in the real-time processor circuitry 118. The real-time processor circuitry 118 is directed to transition to a test state of the multi-ramp test routine 130 by the input/output processor circuitry 118 by providing a current state on the current state line 338 and a state transition number on the state transition line 339 (502). Once in the test state, the real-time processor circuitry 118 sets a flag indicative of operation of the equipment under test, such as a relay, to false (504). The real-time processor circuitry 118 may then identify the number of ramps (N) from static operational parameters included in the header file, and initialize a ramp state of the N ramp states using initial dynamic parameters (506).

The initial dynamic operational parameters may be extracted from registers 326 in the test routine database 316. In other examples, the dynamic operational parameters may be stored in other ways in memory circuitry 120. In this example, the dynamic operational parameters for each ramp N are upper limit, lower limit, and ramp value, where the ramp value may initially be equal to the lower limit. The real-time processor circuitry 118 may determine if all N of the ramps identified by the static operational parameter are initialized (508), and if not, initialize the remaining ramp states for the N ramps (506). The state information of each N ramp may be retained in a structure, such as an array, that is updated and monitored by the multi-ramp test routine 130. The array ramp state may be initialized as state information for each of the "N" ramps.

In an example there may be maximum_ramp_count structures, each containing: An "outputValue" which may be a parameter value written to a waveform generation parameter. The "outputValue" may be calculated according to the ramp parameters "mostRecentLowerLimit," and "mostRecentUpperLimit," where copies of lowerLimit and upperLimit dynamic parameters may be used to detect when those parameters change. In this example, the dynamic parameters used may be a Dynamic Parameter RAM block, which is an array with one structure per simultaneous ramp (maximum_ramp_count elements). Values may be dynamically changed by the application processor circuitry 116 while this test routine is executing. Each structure may include: waveform Index (identifies the waveform for which a generation parameter is to be ramped), destination (which parameter to ramp: amplitude, frequency or phase), lowerLimit, upperLimit, rampRate (ramping limits and rate).

Once the N ramps are initialized, the real-time processor circuitry 118 may set a flag indicating whether the relay operated in the previous sample interval (in order to later determine whether the input state changed) (510). The real-time processor 118 may then generate waveform generator parameters (512) for each of the respective N ramps using a ramp index and destination. The ramp index may be an identifier of a respective ramp N, and the destination may be a waveform generator 334, which will output the respective waveform sample values 352 (FIG. 3). The waveform generator parameters may be provided to the input/output processor circuitry 122 (according to the index and destination) via the waveform generation parameters buffer 314 (514). The waveform generator parameters, such as amplitude, phase or frequency, for each index may be retained in the buffer 314 between sample intervals, so the real-time processor circuitry 118 may detect when these parameters are changed by a user by changing the dynamic operational parameters for one of the N ramps. The input/output processor circuitry 116 may, for example, extract the waveform generation parameters from a memory location for a respective ramp N, and provide the parameters to the waveform sample generator 334, which provides waveforms or waveform samples to the equipment under test (516).

Figure 6:
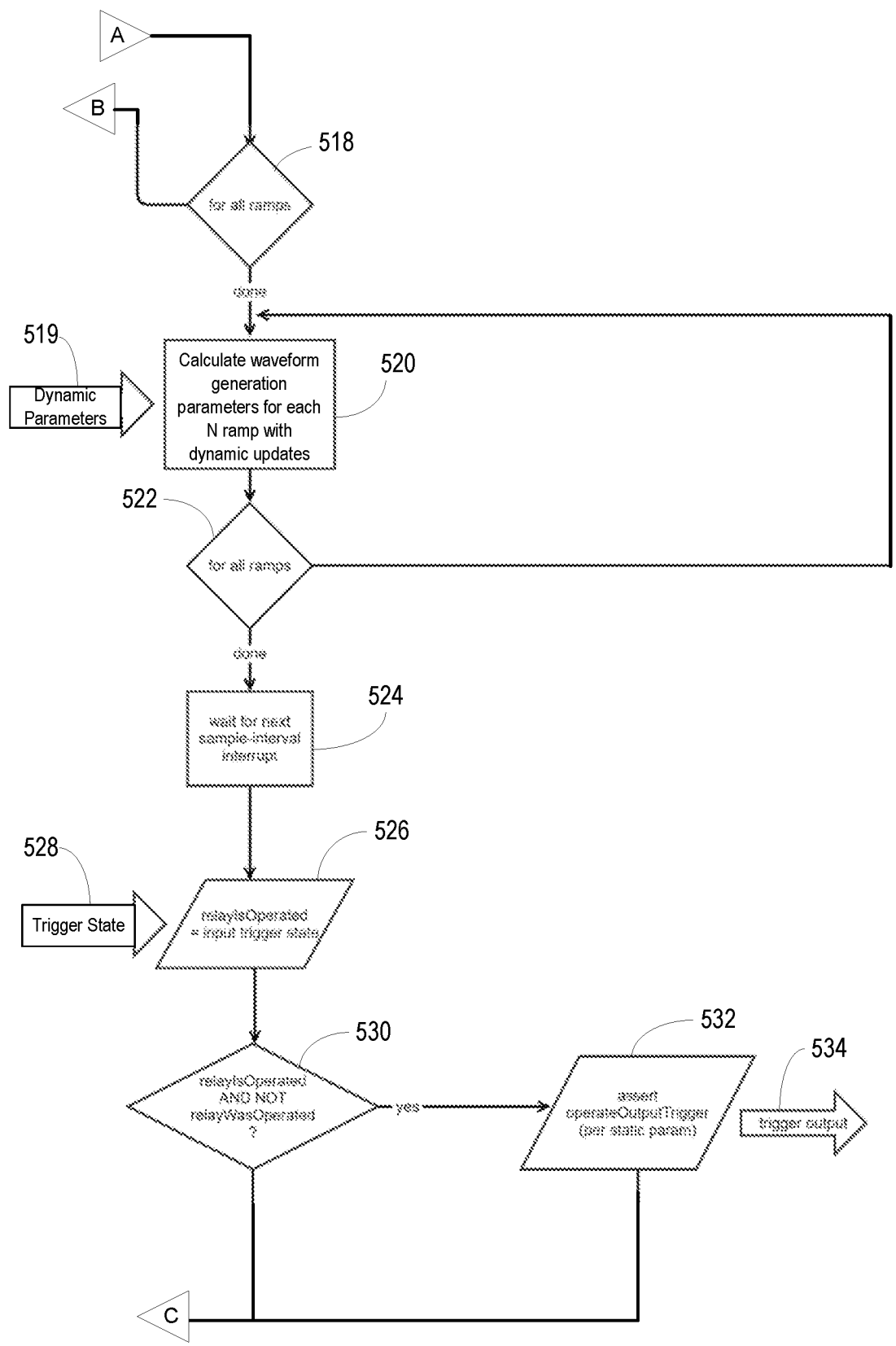
FIG. 6 is a second part of the block diagram of FIG. 5.

FIG. 6 is a second part of the block diagram of FIG. 5. Referring to FIGS. 3 and 6, the real-time processor circuitry 118 may confirm that waveform generation parameters have been written for all N of the ramps (518) and if not, complete the remaining N ramps (512) (FIG. 5). Once all the N ramped waveform generation parameters have been written, the real-time processor circuitry 118 may await a next interrupt from the sample timing 336. Upon receipt of an interrupt, the real-time processor circuitry 118 may check to see if any of the dynamic operational parameters stored in the registers 326 have been updated. The application processor circuitry 116 may update the storage location of the dynamic operational parameters with a new dynamic operational parameter 519 received as an input by the user for a respective ramp N during a test.

For each of the N ramps with updated dynamic operational parameters, the real-time processor circuitry 118 may calculate new respective waveform generation parameters, for provision with the corresponding index and destination to the input/output processor circuitry 122 for the next sample interval (520). The real-time processor circuitry 118 may then determine if the generation parameters have been calculated for all the respective N ramps (522). If not, the real-time processor circuitry 118 may calculate waveform generation parameters for the next one of the N ramps (520) according to any updates to the dynamic operational parameters 519. The real-time processor circuitry 118 may wait for the next sample interval interrupt from the sample timing 336 (524). The real-time processor circuitry 118 may also enforce limits, such as the high and low limits when, for example, the value parameter, such as an amplitude, is updated. In the case where a new user entered dynamic value parameter 519 is outside the limits, the real-time processor circuitry 118 may force the output value into range. In addition, for those ramps N where no updated dynamic operational parameters were detected, the real-time processor circuitry 118 may continuing ramping for the next sample interval according to the existing dynamic operational parameters.

At the next sample-interval interrupt, the real-time processor circuitry 118 may determine if the relay operated (526) by reading a trigger value indexed by input_trigger, and may place the trigger value in a variable, such as a Boolean variable. A trigger state 528 may indicate a source of the trigger bit which caused the relay to operate. The real-time processor circuitry 118 may determine if the relay operated in the current sample interval due to one of the N ramps (530). If yes, the trigger for the respective ramp N may be asserted (532), and a trigger output from the real-time processor circuitry 118 may be provided as a trigger input to the state sequencer 332 (534). In response to the trigger, the real-time processor circuitry 118 may calculate and record test result values, including the as-ramped value, and the other dynamic operational values, for each of the N ramps. The test result values may be provided to the report queue 320.

The methods, devices, processing, circuitry, and logic described above may be implemented in many different ways and in many different combinations of hardware and software. For example, as discussed, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

In some examples, each unit, subunit, and/or module of the system may include a logical component. Each logical component may be hardware or a combination of hardware and software. For example, each logical component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each logical component may include memory hardware, such as a portion of the memory, for example, that comprises instructions executable with the processor or other processors to implement one or more of the features of the logical components. When any one of the logical components includes the portion of the memory that comprises instructions executable with the processor, the logical component may or may not include the processor. In some examples, each logical components may just be the portion of the memory or other physical memory that comprises instructions executable with the processor or other processor to implement the features of the corresponding logical component without the logical component including any other hardware. Because each logical component includes at least some hardware even when the included hardware comprises software, each logical component may be interchangeably referred to as a hardware logical component.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A relay and metering test instrument comprising:
an application processor circuitry configured to execute firmware in the relay and metering test instrument to control functional operation of the relay and metering test instrument, the application processor circuitry further configured to receive a source code state program and operational parameters, the application processor circuitry configured to compile the source code state program and the operational parameters into a test routine;
a real time processor circuitry configured to selectively and independently execute the test routine or one of a plurality of other test routines to perform a plurality of respective test states; and
an input/output processor circuitry cooperatively operable with the real time processor circuitry to output test signals and monitor for receipt of input test signals according to execution of the test routine;
wherein the relay and metering test instrument is configured to enable deployment of a parameter-adjustment algorithm(s) without requiring an update(s) to the firmware in the relay and metering test instrument;
wherein the real time processor circuitry is operable for execution of the parameter-adjustment algorithm(s); and
wherein the application processor circuitry is operable for executing the firmware in the relay and metering test instrument to control functional operation of the relay and metering test instrument.

2. The relay and metering test instrument of claim 1, wherein:
the application processor circuitry is configured to store the test routine and a plurality of other test routines in a memory circuitry that is in communication with the application processor circuitry and with the real time processor circuitry; and
each of the plurality of other test routines are stored in different memory locations in the memory circuitry with a different pointer; and
the input/output processor circuitry is configured to retrieve a pointer from the memory circuitry and direct the real time processor circuitry to execute the corresponding test routine identified with the retrieved pointer.

3. The relay and metering test instrument of claim 1, wherein:
the application processor circuitry is configured to store the test routine and a plurality of other test routines in a memory circuitry that is in communication with the application processor circuitry and with the real time processor circuitry; and
the real time processor circuitry is configured to selectively execute one of the plurality of other test routines at a time when an update to the test routine is being stored in the memory circuitry.

4. The relay and metering test instrument of claim 1, wherein the operational parameters comprise a static operational parameter and a dynamic operational parameter, the static operational parameter compiled with the source code state program into the test routine stored in a memory circuitry, and the dynamic operational parameter stored in a register in the memory circuitry, the register configured for updating with a new operational parameter input during a test, the dynamic operation parameter retrievable from the register, by the real time processor circuitry during execution of a testing stage included in the test routine.

5. The relay and metering test instrument of claim 1, wherein the operational parameters include static parameters included in the test routine, and dynamic parameters provided as inputs during testing, the application processor circuitry configured to write the dynamic parameters to memory locations in a memory circuitry for access by the real time processor circuitry during execution of a testing stage in the test routine.

6. The relay and metering test instrument of claim 5, wherein the static parameters are compiled in a header of an object file containing the test routine.

7. The relay and metering test instrument of claim 1, wherein the source code state program and the operational parameters are received from a computing device in response to a user input to the computing device, the computing device being controlled by a user external to the relay and metering test instrument.

8. The relay and metering test instrument of claim 1, wherein the real time processor circuitry is configured to generate different waveform generation parameters during different testing stages of the test routine, and the input/output processor circuitry is configured to output different waveforms as output test signals in response to the different waveform generation parameters.

9. The relay and metering test instrument of claim 1, wherein the application processor circuitry is configured to receive the source code state program that is selected by a user and the operational parameters that are received as inputs from the user.

10. The relay and metering test instrument of claim 1, wherein the application processor circuitry and the real time processor circuitry comprise separate, distinct, and independently operational processor circuitry.

11. A relay and metering test instrument comprising:
an application processor circuitry configured to execute firmware in the relay and metering test instrument to control functional operation of the relay and metering test instrument, the application processor circuitry further configured to receive a source code state program and operational parameters, the application processor circuitry configured to compile the source code state program and the operational parameters into a test routine;
a real time processor circuitry configured to selectively and independently execute the test routine or one of a plurality of other test routines to perform a plurality of respective test states; and
an input/output processor circuitry cooperatively operable with the real time processor circuitry to output test signals and monitor for receipt of input test signals according to execution of the test routine;
wherein the relay and metering test instrument is configured to enable deployment of a parameter-adjustment algorithm(s) without requiring an update(s) to the firmware in the relay and metering test instrument; and
wherein the relay and metering test instrument is configured such that during execution of the test routine, the test routine:
responds to interrupts that occurs at a waveform generation sample rate by performing calculating based on a count of the interrupts;
responds to changes in the states of outgoing triggers or incoming triggers including a change in state of a trigger of an outgoing trigger in response to a relay operation;
produces triggers by writing triggers to registers accessible to the input/output processor circuitry; and/or
writes report values to a buffer that is accessible to the application processor circuitry.

12. The relay and metering test instrument of claim 11, wherein:

the real time processor circuitry is operable for execution of the parameter-adjustment algorithm(s); and the application processor circuitry is operable for executing the firmware in the relay and metering test instrument to control functional operation of the relay and metering test instrument.

13. A relay and metering test instrument comprising:

an application processor circuitry configured to execute firmware in the relay and metering test instrument to control functional operation of the relay and metering test instrument, the application processor circuitry further configured to receive a source code state program and operational parameters, the application processor circuitry configured to compile the source code state program and the operational parameters into a test routine;

a real time processor circuitry configured to selectively and independently execute the test routine or one of a plurality of other test routines to perform a plurality of respective test states; and an input/output processor circuitry cooperatively operable with the real time processor circuitry to output test signals and monitor for receipt of input test signals according to execution of the test routine;

wherein the relay and metering test instrument is configured to enable deployment of a parameter-adjustment algorithm(s) without requiring an update(s) to the firmware in the relay and metering test instrument;

wherein the real time processor circuitry is configured to generate different waveform generation parameters during different testing stages of the test routine, and the input/output processor circuitry is configured to output different waveforms as output test signals in response to the different waveform generation parameters; and wherein:
the relay and metering test instrument is configured to enable real-time control and adjustment of the different waveform generation parameters that define each of the waveforms being generated, the different waveform generation parameters, for each sinusoidal waveform output, including amplitude, phase angle, relative to a reference, and frequency; and/or the relay and metering test instrument is configured to be operable with parallel processing of the generation of the different waveform generation parameters and processing of triggers, pointers, and state transitions in the different testing stages of the test routine thereby allowing for avoidance of sequential processing and related lag time and delays and allowing for precise timing of dynamic adjustments of generated waveform samples.

14. A method of testing with a relay and metering test instrument comprising:

operating the relay and metering test instrument with an application processor circuitry;

receiving, with the application processor circuitry, a source code state program and an operational parameter;

compiling, with the application processor circuitry, the source code state program and the operational parameter into a test routine;

independently executing, with a real time processor circuitry, a plurality of other test routines to perform a plurality of respective test states;

independently executing, with the real time processor circuitry, the test routine to perform a respective test state, the respective test state being different from the plurality of respective test states; and generating, with an input/output processor circuitry, a sample waveform for equipment under test as directed by execution of the test routine;

wherein the relay and metering test instrument is configured to enable deployment of a parameter-adjustment algorithm(s) without requiring an update(s) to firmware in the relay and metering test instrument; and wherein generating, with the input/output processor circuitry, the sample waveform for the equipment under test comprises:

calculating an amplitude, phase angle and frequency parameters of the sample waveform with the real time processor circuitry in the respective test state;

storing the amplitude, phase angle and frequency parameters of the sample waveform in registers in a memory circuitry; and executing the input/output processor circuitry to extract the amplitude, the phase angle and the frequency parameters from the registers and generate the sample waveform.

15. The method of claim 14, further comprising directing, with the input/output processor circuitry, the real time processor circuitry to execute the test routine at a memory location provided by the input/output processor circuitry, the memory location of the test routine identified to the input/output processor circuitry by the application processor circuitry.

16. The method of claim 14, further comprising:

with the application processor circuitry, identifying a respective memory location in a memory circuitry where the test routine is stored with a plurality of other test routines; and generating and storing a respective pointer to the respective memory location in the memory circuitry, the respective pointer accessed by the input/output processor circuitry to direct the real time processor circuitry to execute the test routine stored at the memory location.

17. The method of claim 16, further comprising transitioning from execution of the test routine in the respective test state to execution of another test routine in another test state by the input/output processor circuitry directing the real time processor circuitry to a memory location of the another test routine, wherein the another test state is at least one of the plurality of respective test states.

18. The method of claim 14, wherein:
controlling and adjusting, in real time, different sample waveform generation parameters that define each of the sample waveforms being generated; and/or generating different sample waveform generation parameters and processing of triggers, pointers, and state transitions in different testing stages of the test routine via parallel processing, thereby allowing for avoidance of sequential processing and related lag time and delays and allowing for precise timing of dynamic adjustments of generated waveform samples.

19. The method of claim 14, wherein:
the operational parameter comprises a static operational parameter and a dynamic operational parameter; and
compiling, with the application processor circuitry, comprises compiling the source code state program and the static operational parameter into an object file for storage as the test routine; and generating, with the input/output processor circuitry, the
sample waveform for the equipment under test comprises:
generating the sample waveform according to execution of the test routine for a test of the equipment; and
dynamically adjusting the sample waveform during the execution of the test routine upon receipt of the dynamic operational parameter.

20. The method of claim 14, wherein the application processor circuitry and the real time processor circuitry comprise separate, distinct, and independently operational processor circuitry.

21. The method of claim 14, wherein:
the real time processor circuitry is operable for execution of the parameter-adjustment algorithm(s); and
the application processor circuitry is operable for executing the firmware in the relay and metering test instrument to control functional operation of the relay and metering test instrument.

22. The method of claim 14, wherein the source code state program and the operational parameter are received via a user interface as inputs by a user.

23. A non-transitory computer readable medium storing instructions executable with processor circuitry, the computer readable medium comprising:
instructions executable with the processor circuitry to control functional operation of a relay and metering test instrument;
instructions executable with the processor circuitry to receive a source code state program and operational parameters;
instructions executable with the processor circuitry to compile the source code state program and the operational parameters into a test routine;
instructions executable with the processor circuitry to selectively execute a plurality of test routines, the test routines executable independently in a plurality of respective test states; and
instructions executable with the processor circuitry to output test signals and monitor for receipt of input test signals according to execution of the test routine or one or more of the plurality of test routines;
wherein the instructions executable with the processor circuitry comprise instructions executable with the processor circuitry that enable deployment of a parameter-adjustment algorithm(s) without requiring an update(s) to firmware in the relay and metering test instrument;
wherein the instructions executable with the processor circuitry to selectively execute the test routine further comprises instructions executable with the processor circuitry during a plurality of testing stages of the test routine to generate waveform generation parameters according to the operational parameters during the respective test state, the waveform generation parameters comprising phasor values used by a waveform sample generator to generate different sample waveforms during the plurality of testing stages; and
wherein the instructions executable with the processor circuitry comprise instructions executable with the processor circuitry that enable real-time control and adjustment of the different waveform generation parameters that define each of the waveforms being generated, the different waveform generation parameters, for each sinusoidal waveform output, including amplitude, phase angle, relative to a reference, and frequency.

24. The computer readable medium of claim 23, wherein the instructions executable with the processor circuitry during the plurality of testing stages of the test routine to generate the waveform generation parameters according to the operational parameters further comprise:
instructions executable with the processor circuitry to receive dynamic operational parameters input during the respective test state while the sample waveforms are being generated; and
instructions executable with the processor circuitry to update the waveform generation parameters based on the dynamic operational parameters to generate dynamically adjusted sample waveforms during the respective test state.

25. The computer readable medium of claim 24, wherein the instructions executable with the processor circuitry comprise instructions executable with the processor circuitry that enable parallel processing of the generation of the different waveform generation parameters.

26. The computer readable medium of claim 24, wherein the instructions executable with the processor circuitry comprise instructions executable with the processor circuitry that enable processing of triggers, pointers, and transitions in the different test states of the test routine.

27. The computer readable medium of claim 23, wherein the instructions executable with the processor circuitry comprise instructions executable with the processor circuitry to receive the source code state program that is selected by a user and the operational parameters that are received as inputs from the user.

28. The computer readable medium of claim 23, wherein the instructions executable with the processor circuitry comprise:
instructions executable with the processor circuitry to compile the source code state program and the operational parameters into the test routine and to generate a pointer to a memory storage location of the test routine;
instructions executable with the processor circuitry to store the plurality of test routines and the test routine in a memory circuitry as independently executable; and
instructions executable with the processor circuitry to store pointers to different test routines.

29. The computer readable medium of claim 28, further comprising instructions executable with the processor circuitry to select the test routine or one or more of the plurality of test routines for execution using a respective one of the pointers.

30. The computer readable medium of claim 28, further comprising instructions executable with the processor circuitry to store the test routine as an update of one of the plurality of test routines stored in the memory circuitry.

* * * * *